United States Patent
Chen (10) Patent No.: US 8,350,603 B2
(45) Date of Patent: Jan. 8, 2013

(54) REDUCED SWING SIGNAL

(75) Inventor: Chih-Chia Chen, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 133 days.

(21) Appl. No.: 13/005,006

(22) Filed: Jan. 12, 2011

(65) Prior Publication Data

US 2012/0176189 A1    Jul. 12, 2012

(51) Int. Cl.
   *H03K 3/00*    (2006.01)
(52) U.S. Cl. ......................... 327/112; 327/333
(58) Field of Classification Search .............. 327/108, 327/109, 111, 112, 309, 312, 313, 318, 319, 327/323, 333
   See application file for complete search history.

(56) References Cited

U.S. PATENT DOCUMENTS

| | | | |
|---|---|---|---|
| 6,255,867 B1 * | 7/2001 | Chen | 327/108 |
| 6,624,672 B2 * | 9/2003 | Confaloneri et al. | 327/112 |
| 6,946,893 B2 * | 9/2005 | Hayashi et al. | 327/333 |

OTHER PUBLICATIONS

Garcia, Jose C., et al., "CMOS Driver-Receiver Pair for Low-Swing Signaling for Low Energy On-Chip Interconnects", IEEE Transactions on Very Large Scale Integration (VLSI) Systems, vol. 17, No. 2, Feb. 2009, pp. 331-316.

Ferretti, Marcos, et al., "Low Swing Signaling Using a Dynamic Diode-Connected Driver", Sep. 2001, Department of Electrical Engineering Systems, University of Southern California, Los Angeles, CA.

* cited by examiner

*Primary Examiner* — Jeffrey Zweizig
(74) *Attorney, Agent, or Firm* — Lowe Hauptman Ham & Berner, LLP (57) ABSTRACT

A circuit includes an inverter. The inverter inverts an input signal having an input low voltage level and an input high voltage level to form an output signal having an output high voltage level and an output low voltage level. Compared to the input high voltage level, the output high voltage level is lowered. Alternatively or additionally, compared to the input low voltage level, the output low voltage level is raised.

20 Claims, 9 Drawing Sheets

REDUCED SWING SIGNAL

FIELD

The present disclosure is related to a reduced swing signal.

BACKGROUND

The large parasitic capacitance of through silicon vias (TSVs) generally causes a large dynamic power dissipation while transmission signals are switching at the TSVs. In some approaches, the voltage swing of the transmission signals is reduced to reduce the power dissipation, but extra power supplies, complicated circuit designs, and/or static power consumption are required. For example, in one approach, to avoid the extra supply voltages, a level shifter is designed into the TSV driver-receiver pair. In another approach, the circuit that reduces the signal swing uses a dynamic diode-connected driver that also consumes a static current or static power. In another approach, in addition to the static power consumption, the circuit used to reconstruct the reduced signal to the full swing signal is complicated.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. The driver generates a reduced swing signal transmitting through the TSVs. As a result, the dynamic power dissipation due to signal transmission between two dies connected by a TSV is reduced. Circuitry to reduce the signal swing in accordance with some embodiments does not require extra power supplies, does not consume static power, is relatively simple, and uses only a small die area.

Exemplary Circuit

Figure 1:
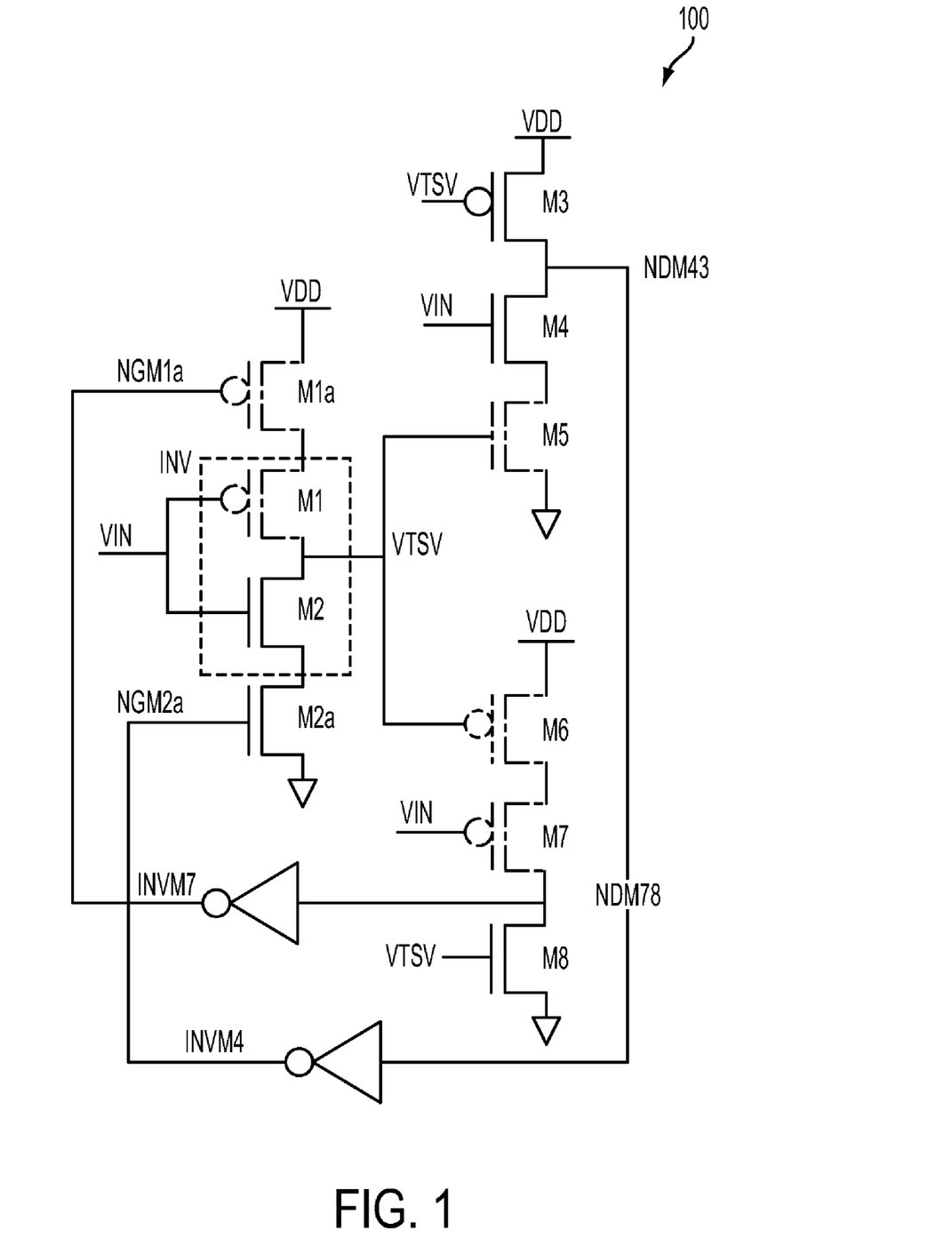
FIG. 1 is a diagram of a driver having a reduced swing output signal, in accordance with some embodiments.

FIG. 1 is a circuit of a driver or transmitter 100 that has a reduced swing output signal, in accordance with some embodiments. PMOS transistor M1 and NMOS transistor M2 form inverter INV. As a result, the logic value of output signal VTSV is the inverse of that of input signal VIN. In some embodiments, input signal VIN has a full swing. That is, the low voltage value of signal VIN is at ground or 0 V, and the high voltage value of signal VIN is at voltage VDD, which is the operational voltage for transmitter 100. In contrast, signal VTSV has a reduced swing. That is, the low voltage value of signal VTSV is raised to voltage VtM5 while the high voltage value of signal VTSV is reduced to VDD−|VtM6|, where VtM5 and VtM6 are the threshold voltages of respective NMOS transistor M5 and PMOS transistor M6.

PMOS transistor M1a serves as a header that prevents signal VTSV from being charged up to voltage VDD at the source of transistor M1a. In some embodiments, transistor M1a limits signal VTSV to be charged up to voltage VDD−|VtM6| where |VtM6| is the absolute value of threshold voltage VtM6. In other words, when signal VTSV is High, the voltage level of signal VTSV is at voltage VDD−|VtM6|, i.e., reduced by |VtM6|.

NMOS transistor M2a serves as a footer that prevents signal VTSV from being discharged down to ground at the source of transistor M1a. In some embodiments, transistor M2a limits signal VTSV to be discharged down to voltage VtM5. In other words, when signal VTSV is Low, signal VTSV is at voltage VtM5, i.e., is raised by voltage VtM5.

In some embodiments, transistor M3 is designed to have a driving capability less than that of transistor M5 so that when both transistors M3 and M5 are trying to pull signal VM43 (not labeled) at node NDM43, the voltage level of signal VM43 is dominated by transistor M5. Similarly, transistor M8 is designed to have a driving capability less than that of transistor M6 so that when both transistors M6 and M8 are trying to pull signal VM78 (not labeled) at node NDM78, the voltage level of signal VM78 is dominated by transistor M6.

Charging Signal VTSV to Voltage VDD−|VtM6|

Figure 2:
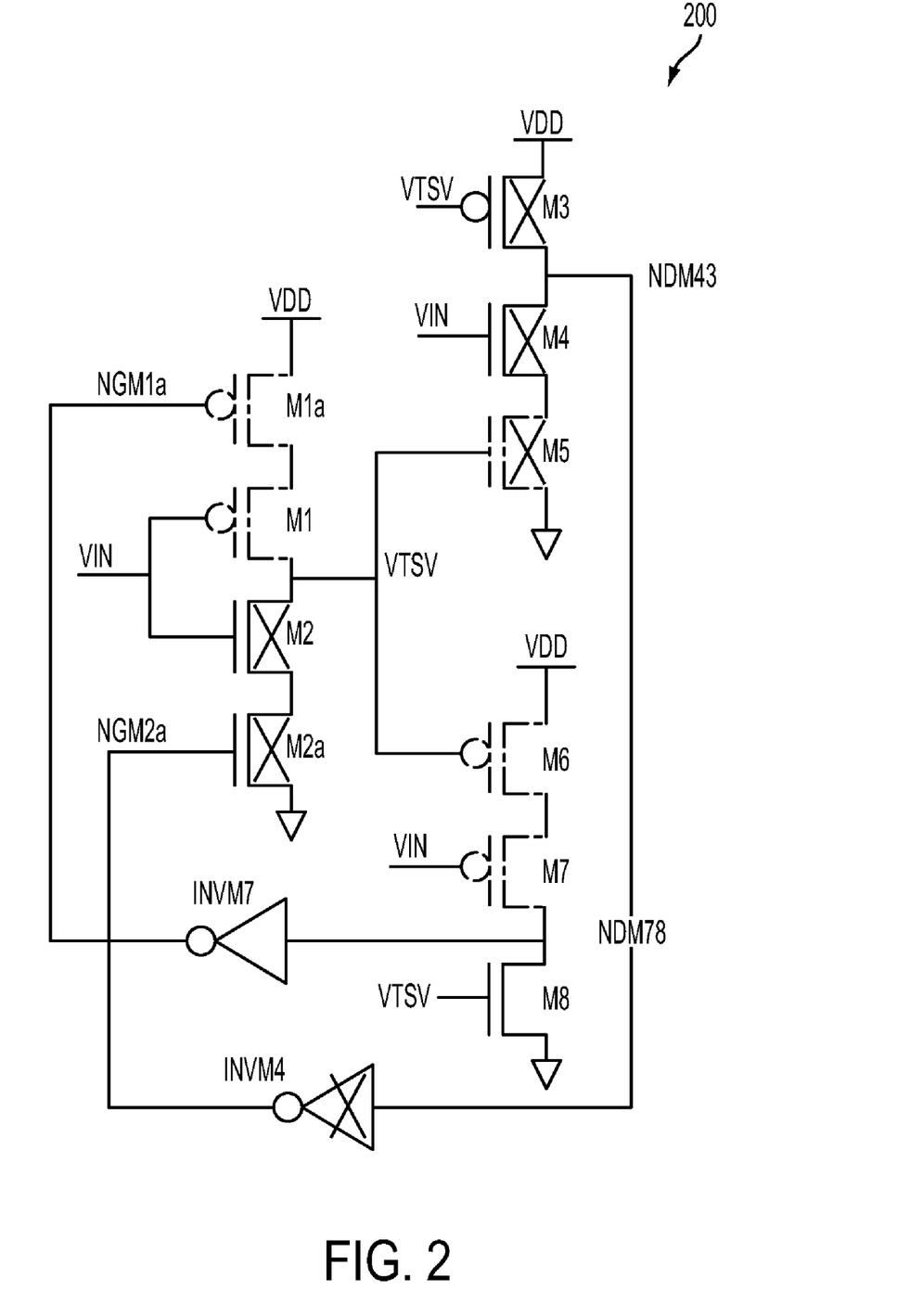
FIG. 2 is a diagram of a circuit illustrating the operation of the driver in FIG. 1 in which the input signal is switching from a high logic level to a low logic level, in accordance with some embodiments.

FIG. 2 is a diagram of circuit 200 used to illustrate the operation of circuit 100 when signal VIN is transitioning from a high voltage level (High) to a low voltage level (Low), and signal VTSV is transitioning from a Low to a High. Transistors M2, M2a, M3, M4, and M5 and inverter INVM4 are marked with an X to indicate that after signal VIN reaches a Low, transistors M2, M2a, M3, M4, and M5 and inverter INVM4 do not have impact on the transition of signal VTSV.

For illustration purposes, initially input signal VIN is High. Signal VIN at the gate of PMOS transistor M1 being High turns off transistor M1. As a result, transistors M1 and M1a act as open circuits. Because signal VIN is High, signal VTSV is Low, which is depicted in the following illustration. In some embodiments, the Low of signal VTSV is at voltage VtM5. Because signal VTSV at the gate of NMOS transistor M5 is at voltage VtM5, transistor M5 is on. Signal VIN at the gate of NMOS transistor M4 being High turns on transistor M4. Signal VTSV at the gate of PMOS transistor M3 being Low turns on transistor M3. In some embodiments, because transistor M3 has a driving capability less than that of transistor M5, i.e., transistor M3 is weaker than transistor M5, signal VM43 at node NDM43 is pulled to the ground of transistor M5, which is Low. Inverter INVM4 inverts the Low of signal VM43 to form a High for signal NGM2a. Signal NGM2a at the gate of NMOS transistor M2a, being High, turns on transistor M2a. Because transistor M2 and transistor M2a are on, signal VTSV is pulled to ground at the source of transistor M2a, which results in the condition that signal VIN is High and signal VTSV is Low.

When signal VIN at the gates of NMOS transistor M2 and PMOS transistor M1 transitions from a High and reaches a Low, transistor M2 is off and transistor M1 is on. Because transistor M2 is off, transistors M2 and M2a act as open circuits. As a result, signal VTSV is not affected by signal NGM2a, inverter INVM4, signal NDM4, and transistors M3, M4, and M5. Consequently, for illustration, transistors M2, M2a, M3, M4, and M5 and inverter INVM4 are marked with an X.

Initially, when signal VIN is High, signal VTSV is Low. Signal VTSV at the gate of NMOS transistor M8 being low turns off transistor M8. At the same time, signal VTSV at the gate of PMOS transistor M6 being Low turns on transistor M6. When signal VIN at the gate of PMOS transistor M7 reaches a Low, transistor M7 is turned on. Transistors M6 and M7 being on pull signal VN78 at node NDM78 to voltage VDD at the source of transistor M6. Inverter INVM7 inverts signal VM78 at node NDM78 to form a Low for signal NGM1a at the gate of transistor M1a. As a result, transistor M1a is turned on. When signal VIN at the gate of PMOS transistor M1 reaches a Low, transistor M1 is turned on. Because transistors M1 and M1a are on, voltage VTSV at the drain of transistor M1 is pulled up towards voltage VDD of transistor M1a. As soon as signal VTSV at the gate of transistor PMOS M6 reaches voltage VDD−|VtM6|, however, transistor M6 is turned off, and transistors M6 and M7 act as open circuits. At the time signal VTSV at the gate of transistor NMOS M8 reaches voltage VtM8, transistor M8 is turned on. Signal VTSV at the gate of transistor M8 continues to rise, and, by the time signal VTSV reaches voltage VDD−|VtM6|, transistor M8 has been on. Because transistor M8 is on, signal VM78 at node NDM78 at the drain of transistor M8 is pulled down to ground at the source of transistor M8. Inverter INVM7 inverts the Low of signal VM78 to form a High for signal NGM1a at the gate of transistor M1a, which turns off transistor M1a. Transistor M1a being off causes charging of signal VTSV towards voltage VDD of transistor M1a to stop. In effect, signal VTSV is charged or pulled up to voltage VDD−|VtM6|, instead of being pulled up to voltage VDD of transistor M1a.

In some embodiments, after signal VTSV is charged (i.e., pulled up) to voltage VDD−|VtM6|, capacitance CTSV (not labeled) at node of signal VTSV provides charges to hold signal VTSV at the voltage value VDD−|VtM6|.

In some embodiments, when transistors M3, M4, and M5 are on (explained above), transistor M3 tries to pull up node NDM43 to voltage VDD at the source of transistor M3. At the same time, transistor M5 tries to pull down node NDM43 to ground at the source of transistor M5. As a result, in some embodiments, transistor M3 is designed to have a driving capability weaker than that of transistor M5 so that transistor M5 pulls the voltage level VM43 at node NDM43 to ground at the source of transistor M5, instead of transistor M3 pulling up voltage VM43 to voltage VDD at the source of transistor M3. In other words, transistors M3 and M5 are designed such that the operational current IDSsat of transistor M3 is smaller than that of transistor M5. In some embodiments, reducing the width and/or increasing the channel length of transistor M3 results in a weaker transistor M3, i.e., a transistor M3 having a smaller current IDSsat. Similarly, increasing the width and/or decreasing the length of transistor M5 results in a stronger transistor M5, i.e., a transistor M5 having a higher current IDSsat. When transistor M5 is stronger than transistor M3 and both transistors M3 and M5 are trying to pull the voltage level of signal VM43 at node NDM43, signal VM43 is pulled down to ground at the source of transistor M5, instead of being pulled up to voltage VDD at the source of transistor N3. Stated differently, current IDSsat provided by transistor M5 mainly influences signal VM43 or signal VM43 is dominantly affected by transistor M5. In some embodiments, the relative driving capabilities of transistors M3 and M5 are determined by simulation. For example, signal VM43 is observed. The size of transistor M3 is then adjusted to a point where the swing level of signal VM43 is dominated by transistor M5, and the size of transistor M3 is selected. In some embodiments, the driving capability of transistor M3 is about ⅕ that of transistor M5.

Discharging Signal VTSV to Voltage VtM5

Figure 3:
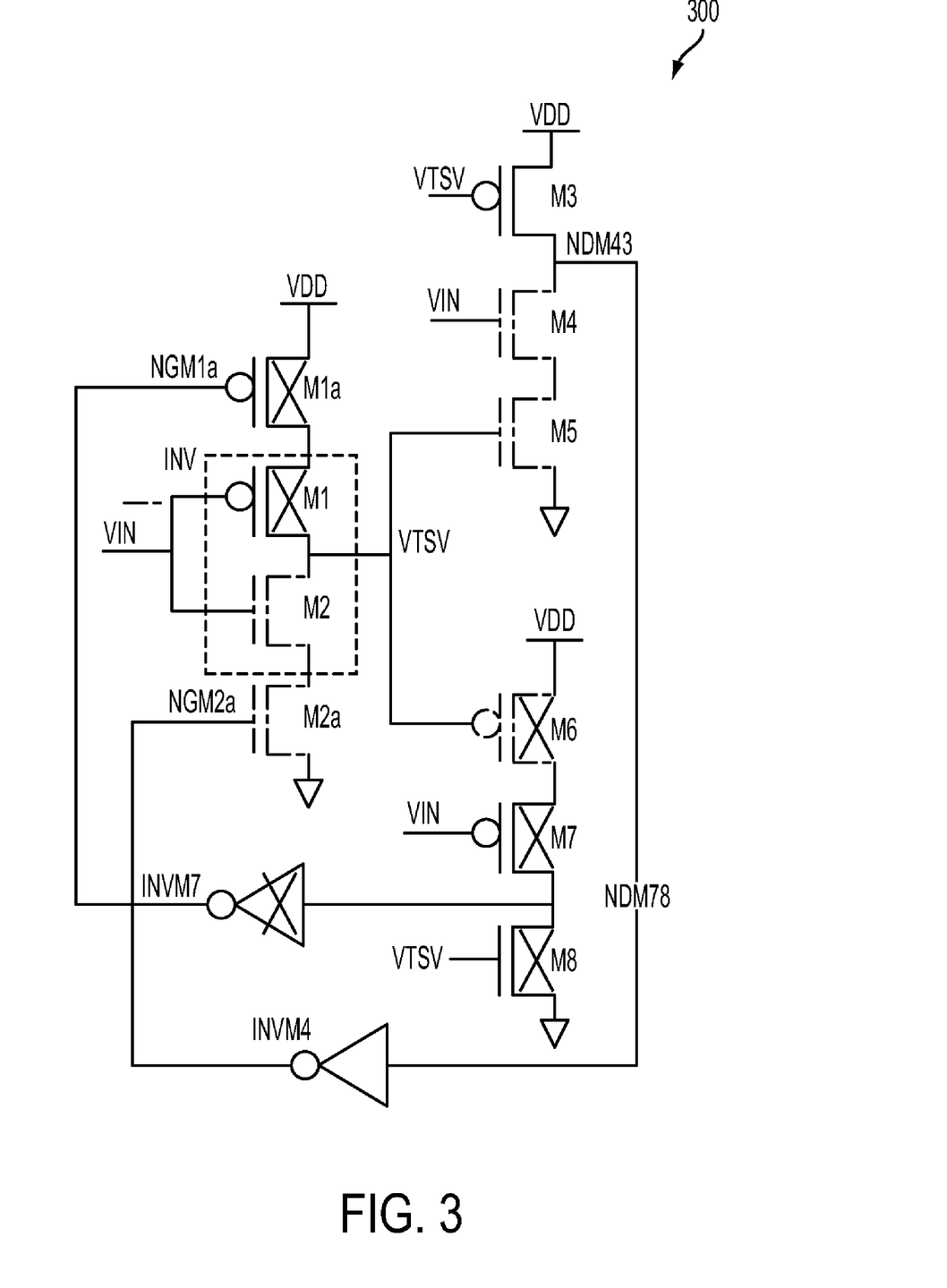
FIG. 3 is a diagram of a circuit illustrating the operation of the driver in FIG. 1 in which the input signal is switching from a low logic level to a high logic level, in accordance with some embodiments.

FIG. 3 is a diagram of a circuit 300 used to illustrate the operation of circuit 100 when signal VIN is transitioning from a Low to a High, and signal VTSV is transitioning from a High to a Low. Transistors M1, M1a, M6, M7, and M8 and inverter INVM7 are marked with an X to indicate that after signal VIN reaches a High transistors M1, M1a, M6, M7, and M8 and inverter INVM7 do not have impact on the transition of signal VTSV.

For illustration purposes, initially input signal VIN is Low. Signal VIN at the gate of NMOS transistor M2 being Low turns off transistor M2. As a result, transistors M2 and M2a act as open circuits. Because signal VIN is Low, signal VTSV, through operation of inverter INV, is High, which is depicted in the following illustration. In some embodiments, when signal VTSV is High, signal VTSV is at voltage VDD−|VtM6|. Because signal VTSV at the gate of PMOS transistor M6 is at voltage VDD−|VtM6|, transistor M6 is on. Signal VIN at the gate of PMOS transistor M7 being Low turns on transistor M7. Signal VTSV at the gate of NMOS transistor M8 being High turns on transistor M8. In some embodiments, because transistor M8 has a driving capability less than that of transistor M6, i.e., transistor M8 is weaker than transistor M6, signal VM78 at node NDM78 is pulled to voltage VDD at the source of transistor M6, which is High. Inverter INVM7 inverts the High of signal VM78 to form a Low for signal NGM1a. Signal NGM1a at the gate of PMOS transistor M1a being Low turns on transistor M1a. Because transistor M1 and transistor M1a are on, signal VTSV at the drain of transistor M1 is pulled to voltage VDD at the source of transistor M1a, which results in the condition that signal VIN is Low and signal VTSV is High.

When signal VIN at the gates of PMOS transistor M1 and NMOS transistor M2 transitions from a Low and reaches a High, transistor M1 is off and transistor M2 is on. Because transistor M1 is off, transistors M1 and M1a act as open circuits. As a result, signal VTSV at the drain of transistor M1 is not affected by signal NGM1a, inverter INVM7, signal NV78 at node NDM78, and transistors M6, M7, and M8. Consequently, for illustration, transistors M1, M1a, M6, M7, and M8, and inverter INVM7 are marked with an X.

Initially, when input signal VIN of inverter INV is Low, output signal VTSV is High by operation of inverter INV. Signal VTSV at the gate of PMOS transistor M3 being High turns off transistor N3. At the same time, signal VTSV at the gate of NMOS transistor M5 being High turns on transistor M5. Because signal VIN at the gate of transistor NMOS M4 transitions from a Low and reaches a High, transistor M4 is turned on. Transistors M4 and M5 being on pull signal VM43 at node NDM43 towards ground at the source of transistor M5, which is Low. Inverter INV4 inverts the Low of voltage NV43 to form a High for signal NGM2a at the gate of NMOS transistor M2a. As a result, transistor M2a is turned on. When signal VIN at the gate of NMOS transistor M2 reaches a High, transistor M2 is turned on. Because transistors M2 and M2a are on, voltage VTSV at the drain of transistor M2 is pulled down towards ground at the source of transistor M2a.

As soon as signal VTSV at the gate of transistor M5 passes below voltage VtM5, however, transistor M5 is turned off, and transistors M4 and M5 act as open circuits. At the time signal VTSV at the gate of transistor M3 reaches voltage VDD−|VtM3|, transistor M3 is on. By the time signal VTSV reaches voltage VtM5, transistor M3 has been on. Because transistor M3 is on, signal VM43 at node NDM43 is pulled up to voltage VDD at the source of transistor M3. Inverter INV4 inverts the High of signal VM43 to form signal NGM2a at the gate of NMOS transistor M2a having a Low, which turns off transistor M2a. As a result, discharging signal VTSV at the drain of transistor M2 towards ground at the source of transistor M2a is stopped. In effect, signal VTSV is discharged or pulled down to voltage VtM5, instead of being pulled down to ground at the source of transistor M2a.

In the above illustration, the high logic level of signal VTSV is reduced to voltage VDD−|VtM6| while the low logic level of signal VTSV is raised to voltage VtM5, forming a reduced signal VTSV. In various embodiments, however, only one logic level of signal VTSV is changed. That is, the high logic level is reduced while the low logic level remains at ground or the high logic level remains at voltage VDD while the low logic level is raised.

Reducing The High Logic Level But Maintaining the Low Logic Level

Figure 4:
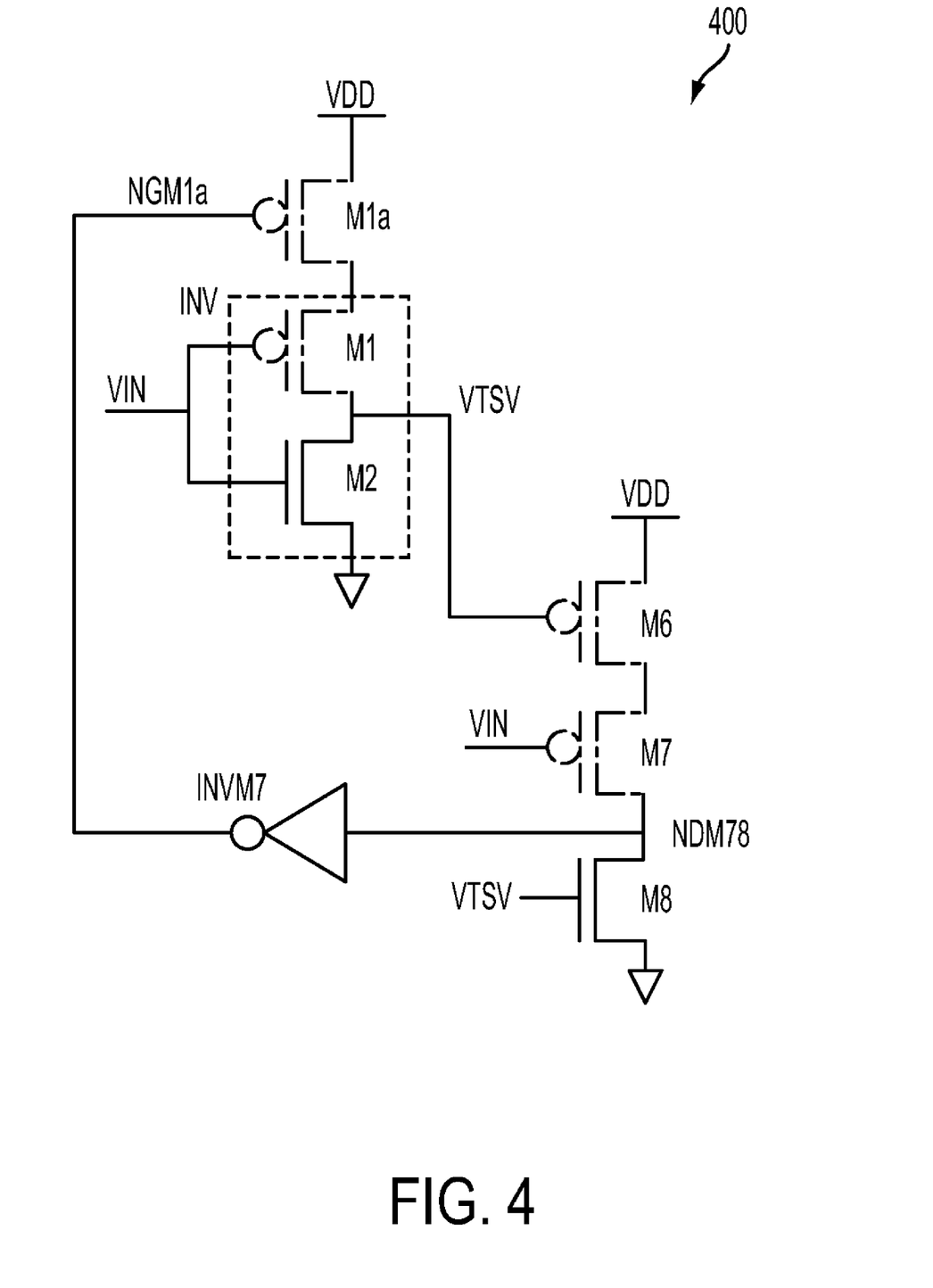
FIG. 4 is a diagram of a circuit in which an input signal is inverted to provide an output signal, but the high logic level of the inverted output signal is lowered compared to that of the input signal, while the low logic level of the inverted output signal remains at the same level as that of the input signal, in accordance with some embodiments.

FIG. 4 is a diagram of circuit 400 illustrating the high logic level of signal VTSV is reduced to voltage VDD−|VtM6| while the low logic level of signal VTSV remains at the normal low logic level, i.e., ground, in accordance with some embodiments.

Compared with circuit 200, circuit 400 does not include transistors M2a, M3, M4, and M5, or inverter INVM4. Further, the source of transistor M2 is coupled to ground.

Initially, when input signal VIN at the gate of PMOS transistor M1 is High, transistor M1 is turned off. At the same time, signal VIN at the gate of NMOS transistor M2 being high turns on transistor M2. Consequently, signal VTSV at the drain of transistor M2 is pulled down to the voltage level at the source of transistor M2, which is ground or Low. Signal VTSV at the gate of transistor PMOS M6 being low turns on transistor M6. Signal VTSV at the gate of NMOS transistor M8 being low turns off transistor M8.

When signal VIN at the gate of PMOS transistor M1 transitions from a High and reaches a Low, transistor M1 is turned on. Signal VIN at the gate of PMOS transistor M7 being Low also turns on transistor M7. Transistor M6 has been on as explained above. Because transistor M8 is off, and transistors M6 and M7 are on, voltage VM78 at node NDM78 is pulled to voltage VDD at the source of transistor M6, which is High. Inverter INVM7 inverts the High of voltage VM78 to form a Low for signal NGM1a at the gate of transistor M1a, which turns on transistor M1a. Because transistors M1 and M1a are on, signal VTSV at the drain of transistor M1 is pulled towards voltage VDD at the source of transistor M1a.

As soon as signal VTSV increases and reaches voltage VDD−|VtM6|, however, transistor M6 is turns off. When signal VTSV at the gate of NMOS transistor M8 passes above voltage VtM8, transistor M8 is turned on. At the time signal VTSV reaches VDD−|VtM6|, transistor M6 is off, and transistors M6 and M7 act as open circuits. Because transistors M6 and M7 act as open circuits and transistor M8 is on, signal NV78 at node NDM78 is pulled to ground at the source of transistor M8, which is Low. Inverter INVM7 inverts the Low of signal NV78 to form a High for signal NGM1a at the gate of PMOS transistor M1a, which turns off transistor M1a. Consequently, charging signal VTSV at the drain of transistor M1 towards the source of transistor M1a is stopped. In effect, signal VTSV at the source of transistor M1 is charged or pulled up, but is limited to voltage VDD−|VtM6|.

Reducing the Low Logic Level But Maintaining the High Logic Level

Figure 5:
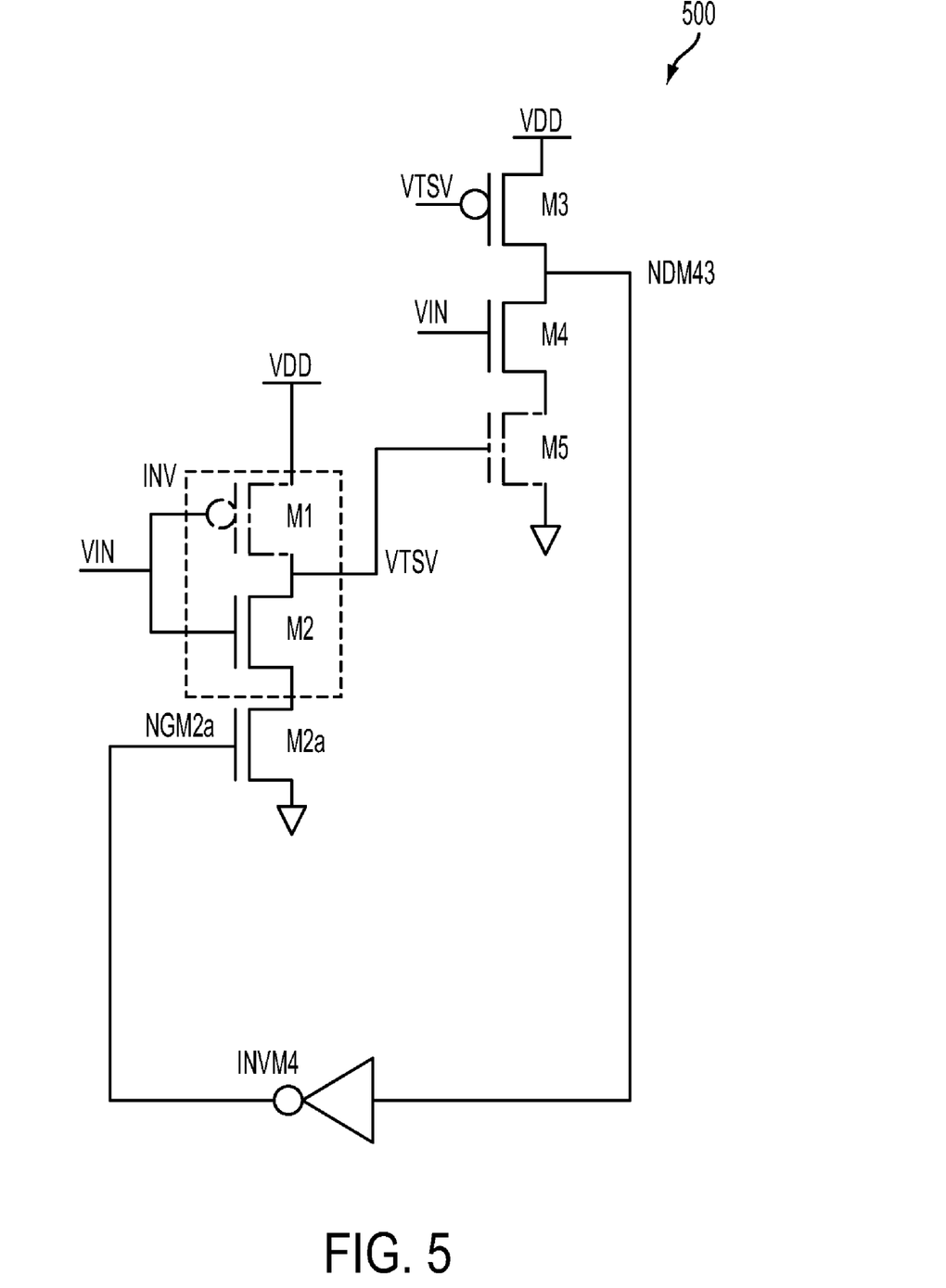
FIG. 5 is a diagram of a circuit in which an input signal is inverted to provide an output signal, but the low logic level of the inverted output signal is raised compared to that of the input signal, while the high logic level of the inverted output signal remains at the same level as that of the input signal, in accordance with some embodiments.

FIG. 5 is a diagram of circuit 500 illustrating the low logic level of signal VTSV is raised to voltage VtM5 while the high logic level of signal VTSV remains at the normal high logic level VDD, in accordance with some embodiments.

Compared with circuit 300, circuit 500 does not include transistors M1a, M6, M7, and M8, or inverter INVM7. Further, the source of transistor M1 is coupled to voltage VDD.

Initially, when input signal VIN at the gate of NMOS transistor M2 is Low, transistor M2 is turned off. At the same time, signal VIN at the gate of PMOS transistor M1 being low turns on transistor M1. Consequently, signal VTSV at the drain of transistor M1 is pulled up to the voltage level at the source of transistor M1, which is voltage VDD or High. Signal VTSV at the gate of NMOS transistor M5 being high turns on transistor M5. Signal VTSV at the gate of PMOS transistor M3 being high turns off transistor M3.

When signal YIN at the gate of NMOS transistor M2 transitions from a Low and reaches a High, transistor M2 is turned on. Signal VIN at the gate of NMOS transistor M4 being High also turns on transistor M4. Transistor M5 has been on as explained above. Because transistor M3 is off, and transistors M4 and M5 are on, voltage VM43 at node NDM43 is pulled to ground at the source of transistor M5, which is Low. Inverter INVM4 inverts the Low of voltage VM43 to form a High for signal NGM2a at the gate of NMOS transistor M2a, which turns on transistor M2a. Because transistors M2 and M2a are on, signal VTSV at the drain of transistor M2 is pulled towards ground at the source of transistor M2a.

As soon as signal VTSV decreases and reaches voltage VtMS, however, transistor M5 is turned off. When signal VTSV at the gate of PMOS transistor M3 passes below voltage VtM5, transistor M3 is turned on. At the time signal VTSV reaches voltage VtMS, NMOS transistor M5 is turned off. Transistors M4 and M5 act as open circuits. Because transistors M4 and M5 act as open circuits and transistor M3 is on, signal NV43 at node NDM43 is pulled to voltage VDD at the source of transistor M3, which is High. Inverter INVM4 inverts the High of signal NV43 to form a Low for signal NGM2a at the gate of NMOS transistor M2a, which turns off transistor M2a. Consequently, discharging signal VTSV at the drain of transistor M2 towards the source of transistor M2a is stopped. In effect, signal VTSV at the drain of transistor M2 is discharged or pulled down, but is limited to voltage VtM5.

Recovering the Reduced Signal VTVS

In some embodiments, after the normal or full swing signal VIN is transmitted to one end of the through silicon via (TSV), signal VIN is reduced to signal VTSV so that the dynamic power is reduced while reduced signal VTSV is transmitted through the TSV. After reduced signal VTSV is transmitted through the TSV, reduced signal VTSV is then recovered or converted back to full swing signal VIN at the other end of the TSV.

Figure 6:
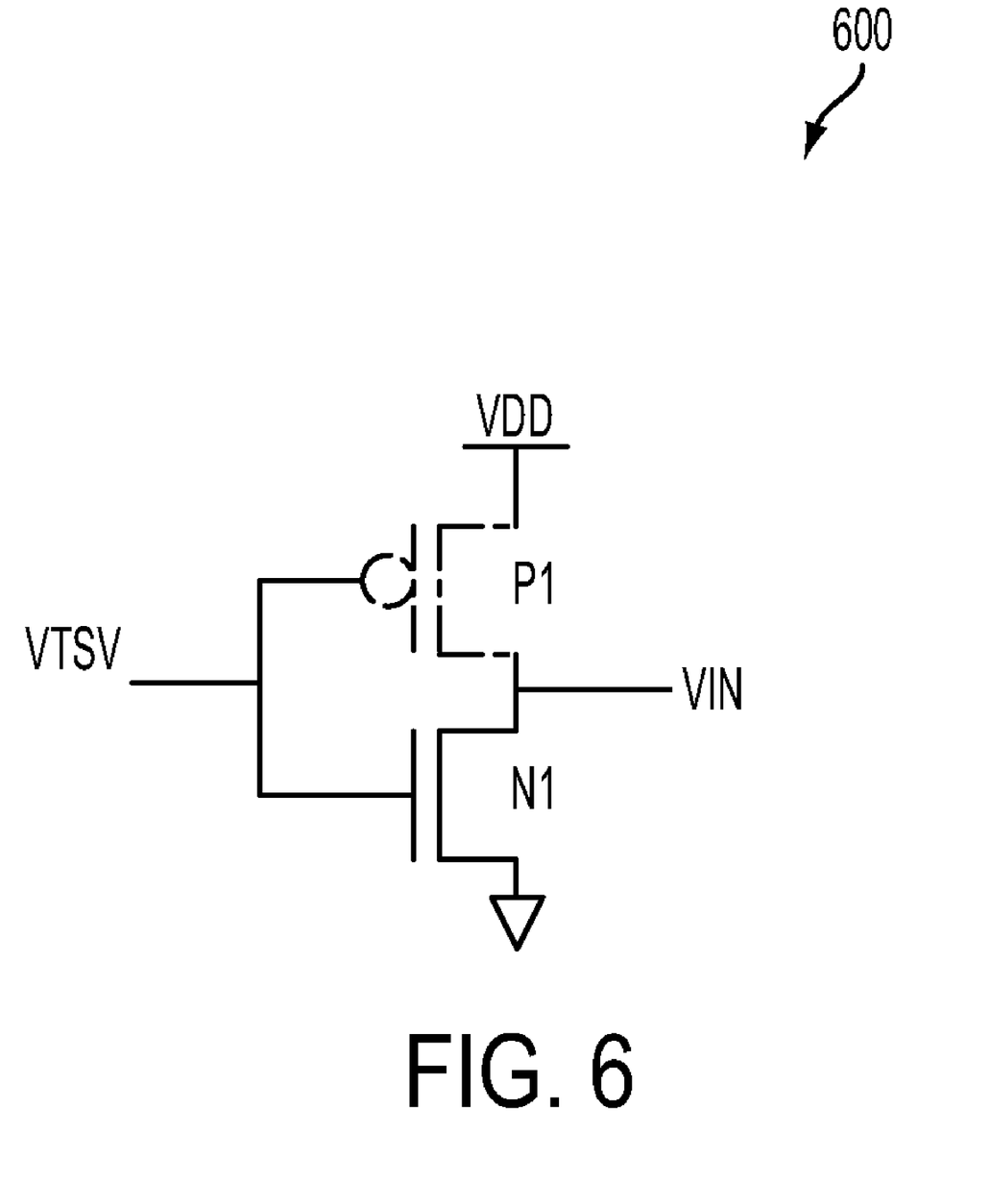
FIG. 6 is a diagram of an inverter illustrating how a reduced signal is recovered to a full swing signal, in accordance with some embodiments.

FIG. 6 is a circuit of an inverter 600 used to convert reduced signal VTSV to normal or full swing signal VIN, in accordance with some embodiments. Inverter 600 is configured to receive reduced signal VTSV as an input at the gates of transistors P1 and N1, and inverts reduced signal VTSV to full swing signal VIN at the drains of transistors P1 and N1 as an output. In some embodiments, when signal VIN is High, signal VIN is at voltage VDD at the source of transistor P1. But when signal VIN is Low, signal VIN is at ground level at the source of transistor N1. In other words, inverter 600 recovers reduced signal VTSV to full swing signal VIN.

For illustration, voltage VGSP1 (not labeled) is the voltage dropped across the gate and the source of transistor P1, which is VTSV-VDD. In some embodiments, when signal VTSV is Low, signal VTSV is at voltage VtM5. As a result, voltage VGSP1 is VtM5-VDD. When signal VTSV, however, is High, signal VTSV is at VDD-|VtM6|. Consequently, voltage VGSP1 is -|VtM6| (i.e., VDD-|VtM6|-VDD). Similarly, voltage VGSN1 is the voltage dropped across the gate and the source of transistor N1, which is VTSV-0V or VTSV. As a result, when signal VTSV is Low, signal VTSV is at voltage VtM5, and voltage VGSN1 is also at voltage VtM5. When signal VTSV is High, however, signal VTSV is at voltage VDD-|VtM6|, and voltage VGSN1 is also at VDD-|VtM6|.

In some embodiments, NMOS transistor N1 is designed to have a threshold voltage VtN1 higher than threshold voltage VtM5 of NMOS transistor M5. Further, PMOS transistor P1 is designed to have a threshold voltage VtP1 wherein |VtP1| is higher than |VtM6| of PMOS transistor M6. As a result, when transistor P1 is fully on transistor N1 is completely off, and vice versa. When signal VIN is High and if transistor P1 is not fully on and/or transistor N1 is not fully off, there would be a competition between transistor P1 pulling signal VIN towards the source of transistor P1 and transistor N1 pulling signal VIN towards the source of transistor N1. As a result, the high voltage level of signal VIN would be affected, e.g., lower than voltage VDD at the source of transistor P1. Alternatively stated, the high voltage level of signal VTSV would not be fully recovered to voltage VDD. Similarly, when signal VIN is High and if transistor N1 is not fully on and/or transistor P1 is not fully off, there would be a competition between transistor P1 pulling signal VIN towards the source of transistor P1 and transistor N1 pulling signal VIN towards the source of transistor N1. As a result, the low voltage level of signal VIN would be affected, e.g., higher than ground at the source of transistor N1. Alternatively stated, the low voltage level of signal VTSV would not be fully recovered to ground.

When signal VTSV at the gate of NMOS transistor N1 is Low at the voltage value of voltage VtM5, voltage VGSN1 is also at voltage VtM5 and is lower than voltage VtN1. Consequently, transistor N1 is completely off. At the same time, voltage VGSP1 is at VtM5-VDD or |VtM6|-VDD, which has an absolute value higher than that of |VtP1|. Consequently, transistor P1 is fully on (i.e., fully conducting). Because transistor P1 is fully conducting, and transistor N1 is completely off, signal VIN at the drain of transistor P1 is pulled up to the voltage level at the source of transistor P1, which is voltage VDD. In effect, the high voltage level of signal VTSV at VDD-|VtM6| at the input of inverter 600 has been converted or recovered to the normal high voltage VDD at the output of inverter 600.

When signal VTSV applied at the gate of PMOS transistor P1 is High at the value of voltage VDD-|VtM6|, voltage VGSP1 is at -|VtM6|, which has an absolute value less than |VtP1|. Consequently, transistor P1 is completely off. At the same time, voltage VGSN1 at the gate of transistor N1 is at VDD-|VtM6|, which is higher than threshold voltage VtN1. Consequently, transistor N1 is fully on (i.e., fully conducting). Because transistor N1 is fully conducting, and transistor P1 is completely off, signal VIN at the drain of transistor N1 is pulled down to the voltage level at the source of transistor N1, which is ground. In effect, the low voltage level of signal VTSV at voltage VtM5 at the input of inverter 600 has been converted or recovered to the normal low voltage or ground at the output of inverter 600.

Similar to the voltage swing reduction of signal VIN to signal VTSV explained in FIGS. 1-5, the voltage swing recovery for reduced signal VTSV to full swing signal VIN can be either for the low level or the high level, but not both. For example, the high voltage level is recovered to voltage VDD, but the low voltage level remains at the raised value VtM5. For another example, the high voltage level remains at the value VDD-|VtM6|, but the low voltage level is recovered to ground, etc.

In some embodiments, inverter 600 is part of a receiver working in conjunction with transmitter 100, but inverter 600 can be at other locations, e.g., be part of transmitter 100.

In the above illustration, the source of transistor P1 at voltage VDD value is used for illustration, other voltage values are within the scope of various embodiments. For example, the source of transistor P1 is applied with a specified voltage value having a value different from voltage VDD. As a result, the high logic value of voltage VTSV is recovered to the specified voltage value. In other words, signal VIN has a high voltage value of the same value as the voltage value specified at the source of transistor P1. Similarly, the source of transistor N1 at the ground level is also used for illustration, other voltage values are within the scope of various embodiments. For example, the source of transistor N1 is replaced with an adjustable voltage source having voltage VSS, and the low logic value of voltage VTSV is recovered to the voltage value specified for voltage VSS. In other words, signal VIN has a low voltage value being the same as the value specified for voltage VSS. Further, the through silicon via is also used for illustration, various embodiments are applicable to other transmitting media, communication media, and the like, including for example, ubump, interposers, etc.

Exemplary Methods

Figure 7:
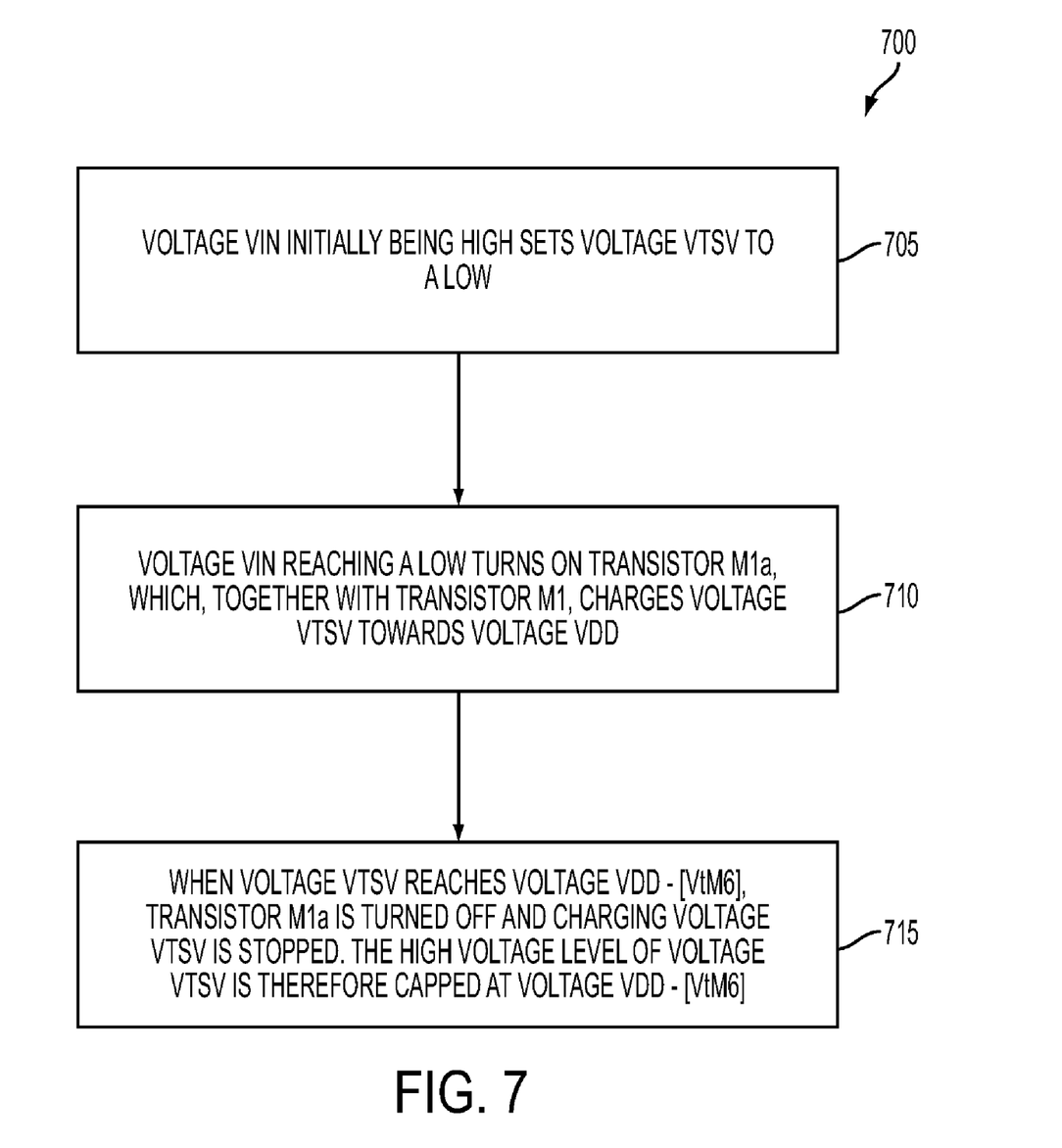
FIG. 7 is a flowchart illustrating an operation of the driver in FIG. 1 in which the input signal transitions from a high logic level to a low logic level, in accordance with some embodiments.

FIG. 7 is a flowchart 700 illustrating the operation of transmitter 100, in accordance with some embodiments. In this illustration, voltage VIN transitions from a High to a Low, and voltage VTSV therefore transitions from a Low to a High, but is capped at voltage VDD−|VtM6|. In other words, the high voltage level of voltage VTSV is reduced from voltage VDD to voltage VDD−|VtM6| by |VtM6|.

In operation 705, when voltage VIN is High, transistor M1 is off, transistors M2, M3, M4, and M5 are on. Transistor M5, however, is stronger than transistor M3. As a result, voltage VM43 is. Low, and voltage NGM2a is High, and transistor M2a is on. Voltage VTSV is therefore Low.

In operation 710, when voltage VIN reaches a Low, transistor M1 is on, transistors M6 and M7 are also on while transistor M8 is off. Consequently, voltage VM78 is High, and voltage NGM1a is Low, turning on transistor M1a. As a result, voltage VTSV is pulled (i.e., charged) towards voltage VDD at the source of transistor M1a.

In operation 715, when voltage VTSV reaches voltage VDD−|VtM6|, transistor M6 is turned off while transistor M8 has been on, pulling voltage VM78 to a Low, causing voltage NGM1a to be High, which turns off transistor M1a and causes charging voltage VTSV to stop. As a result, voltage VTSV is capped at voltage VDD−|VtM6|. In other words, the high voltage value of voltage VTSV is reduced from VDD to VDD−|VtM6|.

Figure 8:
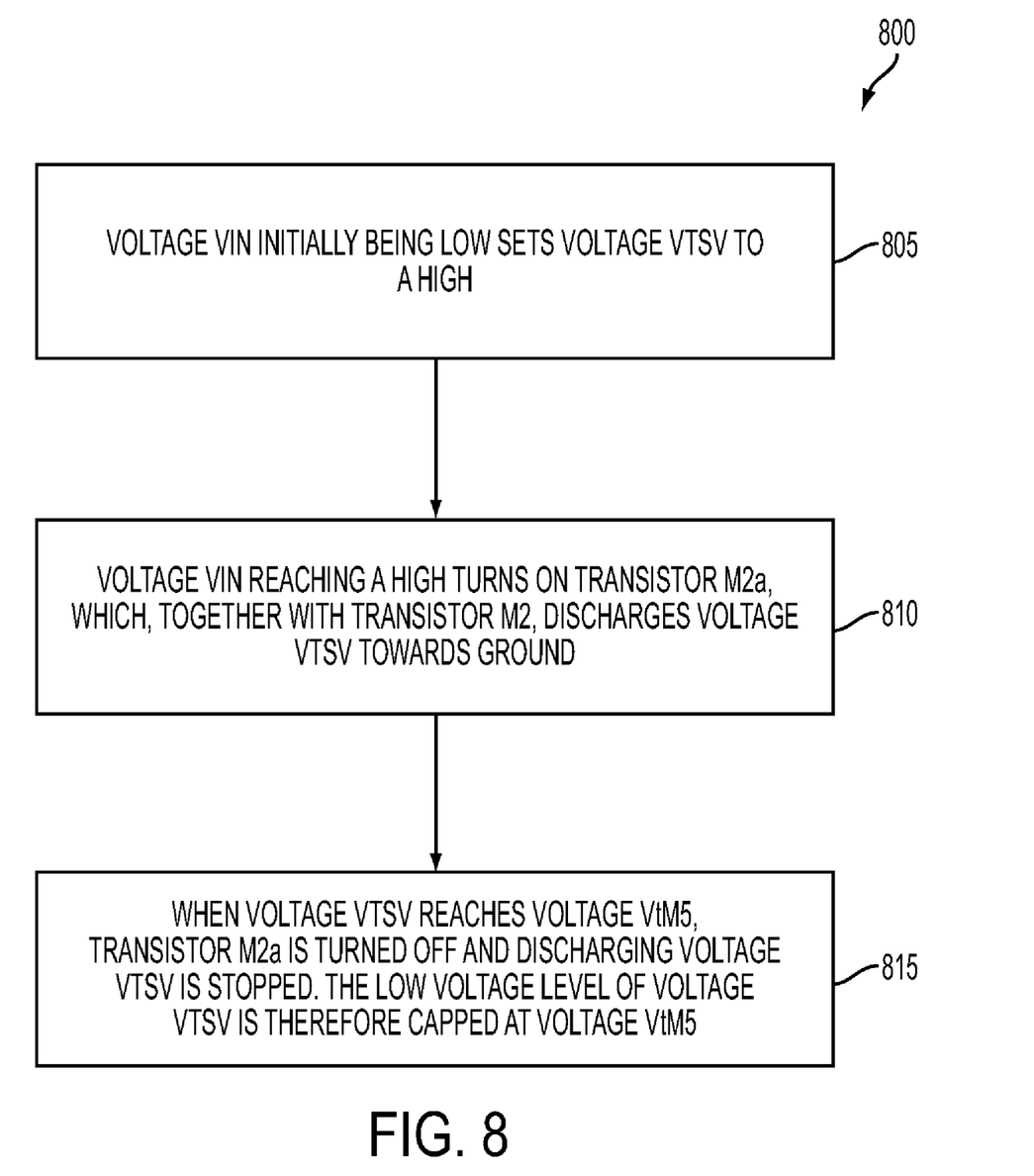
FIG. 8 is a flowchart illustrating an operation of the driver in FIG. 1 in which the input signal transitions from a low logic level to a high logic level, in accordance with some embodiments.

FIG. 8 is a flowchart 800 illustrating the operation of transmitter 100, in accordance with some embodiments. In this illustration, voltage VIN transitions from a Low to a High, and voltage VTSV therefore transitions from a High to a Low, but is capped at voltage VtM5. In other words, the low voltage level of voltage VTSV is raised from ground to voltage VtM5.

In operation 805, when voltage VIN is Low, transistor M2 is off, transistors M1, M6, M7, and M8 are on. Transistor M6, however, is stronger than transistor M8. As a result, voltage VM78 is High, and voltage NGM1a is Low, and transistor M1a is turned on. Voltage VTSV is therefore High.

In operation 810, when voltage VIN reaches a High, transistor M2 is on, transistors M4 and M5 are also on while transistor M3 is off. Consequently, voltage VM43 is Low, and voltage NGM2a is High, turning on transistor M2a. As a result, voltage VTSV is pulled towards ground (e.g., discharged) at the source of transistor M2a.

In operation 815, when voltage VTSV reaches voltage VtM5, transistor M5 is turned off while transistor M3 has been on, pulling voltage VM43 to a High, causing voltage NGM2a to be Low, which turns off transistor M2a and causes discharging voltage VTSV to stop. As a result, voltage VTSV is capped at voltage VtM5. In other words, the low voltage value of voltage VTSV is raised from ground to VtM5.

Figure 9:
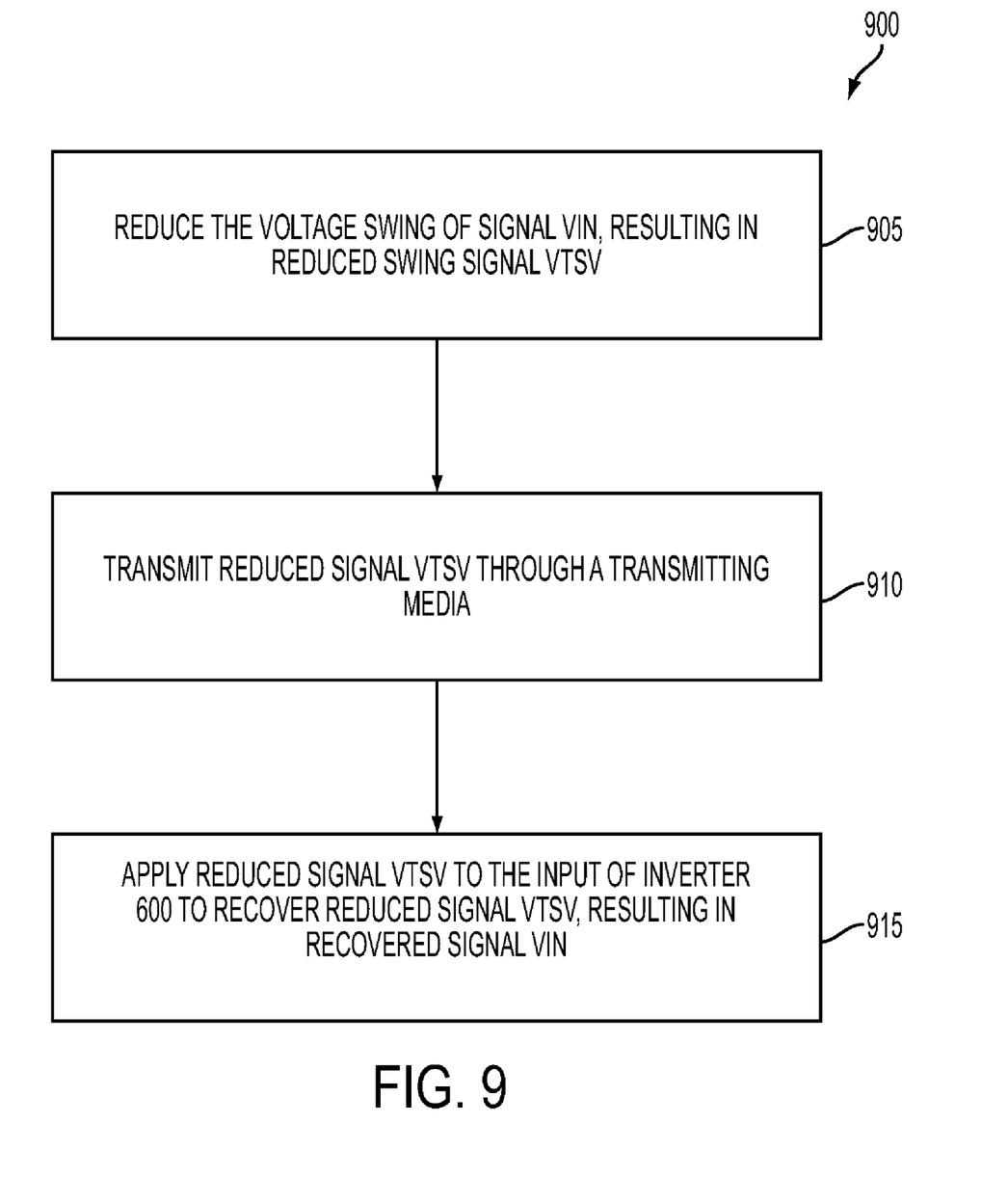
FIG. 9 is a flowchart of a method in which the inverter in FIG. 6 is used, in accordance with some embodiments.

FIG. 9 is a flowchart illustrating a method in which inverter 600 in FIG. 6 is used, in accordance with some embodiments.

In step 905, the voltage swing of input signal VIN is reduced, e.g., by one of the circuit 100, 400, 500, etc., resulting in a reduced signal VTSV.

In step 910, reduced signal VTSV is transmitted through a transmitting media, e.g., a through silicon via.

In step 915, reduced signal VTSV is recovered by applying signal VTSV to the input of inverter 600, resulting in a recovered output signal VIN at the output of inverter 600. The high voltage value of recovered signal VIN is determined by the voltage applied at the source of transistor P1 of inverter 600 while the low voltage value of recovered signal RVIN is determined by the reference voltage applied at the source of transistor N1 of inverter 600.

A number of embodiments have been described. It will nevertheless be understood that various modifications may be made without departing from the spirit and scope of the disclosure. For example, the various transistors being shown as a particular dopant type (e.g., N-type, P-type Metal Oxide Semiconductor or NMOS and PMOS) are for illustration purposes, embodiments of the disclosure are not limited to a particular type, but selecting different dopant types is within the scope of various embodiments. The logic level (e.g., Low or High) of the various signals used in the above description is also for illustration purposes. Various embodiments are not limited to a particular level when a signal is activated and/or deactivated, but, selecting different levels is within the scope of various embodiments.

Some embodiments regard a circuit comprising a first PMOS transistor, a first NMOS, a first second PMOS transistor, a second PMOS transistor, a second NMOS transistor, a second second PMOS transistor, and an inverter having an inverter input and an inverter output. The first PMOS transistor has a first PMOS drain, a first PMOS source, and a first PMOS gate. The first NMOS transistor has a first NMOS drain, a first NMOS source, and a first NMOS gate. The first second PMOS transistor has a first second PMOS drain, a first second PMOS source, and a first second PMOS gate. The second PMOS transistor has a second PMOS drain, a second PMOS source, and a second PMOS gate. The second NMOS transistor has a second NMOS drain, a second NMOS source, and a second NMOS gate. The second second PMOS transistor has a second second PMOS drain, a second second PMOS source, and a second second PMOS gate. The first PMOS gate is coupled to the first NMOS gate and the second PMOS gate. The first PMOS drain is coupled to the first NMOS drain, to the second second PMOS gate, and to the second NMOS gate. The first PMOS source is coupled to the first second PMOS drain. The first second PMOS source is configured to receive a supply voltage value. The second PMOS source is coupled to the second second PMOS drain. The second PMOS drain is coupled to the second NMOS drain and to the inverter input. The inverter output is coupled to the first second PMOS gate.

Some embodiments regard a circuit comprising a first PMOS transistor, a first NMOS transistor, a first second NMOS transistor, a second PMOS transistor, a second NMOS transistor, a second second NMOS transistor, and an inverter having an inverter input and an inverter output. The first PMOS transistor has a first PMOS drain, a first PMOS source, and a first PMOS gate. The first NMOS transistor has a first NMOS drain, a first NMOS source, and a first NMOS gate. The first second NMOS transistor has a first second NMOS drain, a first second NMOS source, and a first second NMOS gate. The second PMOS transistor has a second PMOS drain, a second PMOS source, and a second PMOS gate. The second NMOS transistor has a second NMOS drain, a second NMOS source, and a second NMOS gate. The second second NMOS transistor has a second second NMOS drain, a second second NMOS source, and a second second NMOS gate. The first PMOS gate is coupled to the first NMOS gate and the second NMOS gate. The first PMOS drain is coupled to the first NMOS drain, to the second second NMOS gate, and to the second PMOS gate. The first NMOS source is coupled to the first second NMOS drain. The first second PMOS source is configured to receive a reference voltage value. The second NMOS source is coupled to the second second NMOS drain. The second NMOS drain is coupled to the second PMOS drain and to the inverter input. The inverter output is coupled to the first second NMOS gate.

Some embodiments regard a method comprising: driving an input signal having an input low voltage value and an input high voltage value to an inverter input of an inverter, selecting a first voltage value for a supply voltage in order for the inverter to invert the input low voltage value to the output high voltage value having the first voltage value, and selecting a second voltage value for the reference voltage in order for the inverter to invert the input high value to the output low value having the second voltage value. The inverter includes a PMOS transistor and an NMOS transistor. The PMOS transistor has a PMOS drain, a PMOS source, and a PMOS gate and a PMOS threshold voltage. The NMOS transistor has an NMOS drain, an NMOS source, and an NMOS gate and an NMOS threshold voltage. The PMOS gate is coupled to the NMOS gate and serves as the inverter input. The PMOS drain is coupled to the NMOS drain and serves as the inverter output that provides an output signal having an output low voltage value and an output high voltage value. The PMOS source is configured to receive the supply voltage. The NMOS source is configured to receive the reference voltage. At least one of the following conditions is met: the input high voltage value is lowered from an operational supply voltage by a lowered value that is less than an absolute value of the PMOS threshold voltage, and the input low voltage value is raised from a reference level by a raised value that is less than the NMOS threshold voltage.

Some embodiments regard a method comprising reducing a voltage swing of an input signal, thereby resulting in a reduced swing signal; transmitting the reduced swing signal through a transmitting media; and recovering the reduced swing signal; thereby resulting in a recovered swing signal. Reducing the voltage swing includes at least one of the following steps: lowering a signal high value of the input signal by a first PMOS threshold voltage of a first PMOS transistor to form a high voltage value of the reduced swing signal; and raising a signal low value of the input signal by a first NMOS threshold voltage of a first NMOS transistor to form a low voltage value of the reduced swing signal. Recovering the reduced swing signal includes applying the reduced swing signal to an input of an inverter that comprises a second PMOS transistor coupled in series with a second NMOS transistor. A first absolute value of the first PMOS threshold voltage is less than a second absolute value of a second threshold voltage of the second PMOS transistor. The first NMOS threshold voltage is less than a second NMOS threshold voltage of the second NMOS transistor.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A circuit comprising:
a first PMOS transistor having a first PMOS drain, a first PMOS source, and a first PMOS gate;
a first NMOS transistor having a first NMOS drain, a first NMOS source, and a first NMOS gate;
a first second PMOS transistor having a first second PMOS drain, a first second PMOS source, and a first second PMOS gate;
a second PMOS transistor having a second PMOS drain, a second PMOS source, and a second PMOS gate;
a second NMOS transistor having a second NMOS drain, a second NMOS source, and a second NMOS gate;
a second second PMOS transistor having a second second PMOS drain, a second second PMOS source, and a second second PMOS gate; and
an inverter having an inverter input and an inverter output;
wherein
the first PMOS gate is coupled to the first NMOS gate and the second PMOS gate;
the first PMOS drain is coupled to the first NMOS drain, to the second second PMOS gate, and to the second NMOS gate;
the first PMOS source is coupled to the first second PMOS drain;
the first second PMOS source is configured to receive a supply voltage value;
the second PMOS source is coupled to the second second PMOS drain;
the second PMOS drain is coupled to the second NMOS drain and to the inverter input; and
the inverter output is coupled to the first second PMOS gate.

2. The circuit of claim 1 further comprising a first second NMOS transistor having a first second NMOS drain, a first second NMOS source, and a first second NMOS gate, wherein
the first second NMOS drain is coupled to the first NMOS source; and
the first second NMOS transistor is configured to turn off when a voltage value at the first NMOS drain reaches a predetermined value.

3. The circuit of claim 1, wherein the second NMOS transistor is configured to have a driving capability weaker than that of the second second PMOS transistor.

4. The circuit of claim 1 further comprising:
a first second NMOS transistor having a first second NMOS drain, a first second NMOS source, and a first second NMOS gate;
a second inverter having a second inverter input and a second inverter output;
a third PMOS transistor having a third PMOS drain, a third PMOS source, and a third PMOS gate;
a third NMOS transistor having a third NMOS drain, a third NMOS source, and a third NMOS gate; and
a third second NMOS transistor having a third second NMOS drain, a third second NMOS source, and a third second NMOS gate;
wherein
the first second NMOS drain is coupled to the first NMOS source;
the first second NMOS gate is coupled to the second inverter output;
the second inverter input is coupled to the third PMOS drain and the third NMOS drain;
the third PMOS gate is coupled to the first PMOS drain and the first NMOS drain;
the third NMOS gate is coupled to the first PMOS gate and the first NMOS gate;
the third NMOS source is coupled to the third second NMOS drain; and
the third second NMOS gate is coupled to the first PMOS drain and the first NMOS drain.

5. The circuit of claim 4, wherein the circuit is configured to meet at least one of the following conditions:
the second NMOS transistor has a driving capability weaker than that of the second second PMOS transistor; and
the third PMOS transistor has a driving capability weaker than that of the third second NMOS transistor.

6. The circuit of claim 4 further comprising:
an inverter PMOS transistor having an inverter PMOS drain, an inverter PMOS source, an inverter PMOS gate, and an inverter PMOS threshold; and
an inverter NMOS transistor having an inverter NMOS drain, an inverter NMOS source, an inverter NMOS gate, and an inverter NMOS threshold;
wherein
the inverter PMOS gate is coupled to the inverter NMOS gate;
the inverter PMOS drain is coupled to the inverter NMOS drain;
an absolute value of the inverter PMOS threshold is greater than an absolute value of a threshold of the second second PMOS transistor; and
an absolute value of the inverter NMOS threshold is greater than an absolute value of a threshold of the third second NMOS transistor.

7. A circuit comprising:
a first PMOS transistor having a first PMOS drain, a first PMOS source, and a first PMOS gate;
a first NMOS transistor having a first NMOS drain, a first NMOS source, and a first NMOS gate;
a first second NMOS transistor having a first second NMOS drain, a first second NMOS source, and a first second NMOS gate;
a second PMOS transistor having a second PMOS drain, a second PMOS source, and a second PMOS gate;
a second NMOS transistor having a second NMOS drain, a second NMOS source, and a second NMOS gate;
a second second NMOS transistor having a second second NMOS drain, a second second NMOS source, and a second second NMOS gate; and
an inverter having an inverter input and an inverter output;
wherein
the first PMOS gate is coupled to the first NMOS gate and the second NMOS gate;
the first PMOS drain is coupled to the first NMOS drain, to the second second NMOS gate, and to the second PMOS gate;
the first NMOS source is coupled to the first second NMOS drain;
the first second PMOS source is configured to receive a reference voltage value;
the second NMOS source is coupled to the second second NMOS drain;
the second NMOS drain is coupled to the second PMOS drain and to the inverter input; and
the inverter output is coupled to the first second NMOS gate.

8. The circuit of claim 7 further comprising a first second PMOS transistor having a first second PMOS drain, a first second PMOS source, and a first second PMOS gate; wherein
the first second PMOS drain is coupled to the first PMOS source; and
the first second PMOS transistor is configured to turn off when a voltage value at the first PMOS drain reaches a predetermined value.

9. The circuit of claim 7, wherein the first PMOS source is configured to receive a supply voltage.

10. The circuit of claim 7, wherein the second PMOS transistor is configured to have a driving capability less than that of the second second NMOS transistor.

11. The circuit of claim 7 further comprising:
an inverter PMOS transistor having an inverter PMOS drain, an inverter PMOS source, an inverter PMOS gate, and an inverter PMOS threshold;
an inverter NMOS transistor having an inverter NMOS drain, an inverter NMOS source, an inverter NMOS gate, and an inverter NMOS threshold;
wherein
the inverter PMOS gate is coupled to the inverter NMOS gate;
the inverter PMOS drain is coupled to the inverter NMOS drain; and
an absolute value of the inverter NMOS threshold is greater than an absolute value of a threshold of the third second NMOS transistor.

12. A method comprising:
supplying an input signal having an input high voltage value and an input low voltage value to an inverter input of an inverter that includes:
a PMOS transistor having a PMOS drain, a PMOS source, and a PMOS gate and a PMOS threshold voltage;
an NMOS transistor having an NMOS drain, an NMOS source, and an NMOS gate and an NMOS threshold voltage;
wherein
the PMOS gate is coupled to the NMOS gate and serves as the inverter input;
the PMOS drain is coupled to the NMOS drain and serves as the inverter output that provides an output signal having an output low voltage value and an output high voltage value; and
the PMOS source is configured to receive a supply voltage; the NMOS source is configured to receive a reference voltage;
selecting a first voltage value for the supply voltage in order for the inverter to invert the input low voltage value to the output high voltage value having the first voltage value; and
selecting a second voltage value for the reference voltage in order for the inverter to invert the input high voltage value to the output low voltage value having the second voltage value;
wherein at least one of the following conditions is met
the input high voltage value is lowered from the supply voltage by a lowered value that is less than an absolute value of the PMOS threshold voltage; and
the input low voltage value is raised from the reference voltage by a raised value that is less than the NMOS threshold voltage.

13. The method of claim 12, wherein the lowered value is an absolute value of a second PMOS threshold voltage and the raised value is a threshold voltage of a second NMOS threshold voltage.

14. The method of claim 12 further comprising generating the input high voltage value by:
charging the input signal from a low logic level; and
stopping charging the input signal when a voltage value of the input signal reaches the supply voltage minus the lowered value.

15. The method of claim 12 further comprising generating the input low voltage value by:
discharging the input signal from a high logic level; and
stopping charging the input signal when a voltage value of the input signal reaches the raised value.

16. A method comprising:
reducing a voltage swing of an input signal, thereby resulting in a reduced swing signal;
transmitting the reduced swing signal through a transmitting media; and recovering the reduced swing signal; thereby resulting in a recovered swing signal;
wherein
reducing the voltage swing includes at least one of the following steps
generating a high voltage value of the reduced swing signal based on a high voltage value of the input signal and a first PMOS threshold voltage of a first PMOS transistor; and
generating a low voltage value of the reduced swing signal based on a low voltage value of the input signal and a first NMOS threshold voltage of a first NMOS transistor; and
recovering the reduced swing signal includes applying the reduced swing signal to an input of an inverter that comprises a second PMOS transistor coupled in series with a second NMOS transistor;
wherein
a first absolute value of the first PMOS threshold voltage is less than a second absolute value of a second threshold voltage of the second PMOS transistor; and
the first NMOS threshold voltage is less than a second NMOS threshold voltage of the second NMOS transistor.

17. The method of claim 16, wherein the transmitting media is a through silicon via.

18. The method of claim 16 further comprising at least one of the following steps:
converting the low voltage value of the reduced swing signal to a recovered high voltage having a value based on a second voltage value applied at a source of the second PMOS transistor; and
converting the high voltage value of the reduced swing signal to a recovered low voltage having a value based on a first voltage value applied at a source of the second NMOS transistor.

19. The method of claim 16, wherein generating the high voltage value of the reduced swing signal comprises:
charging the reduced swing signal from a high logic level; and
stopping charging the reduced swing signal when a voltage level of the reduced swing signal reaches a supply voltage minus an absolute value of the first PMOS threshold voltage that turns off the first PMOS transistor.

20. The method of claim 16, wherein generating the low voltage value of the reduced swing signal comprises:
discharging the reduced swing signal from a low logic level; and
stopping discharging the reduced swing signal when a voltage level of the reduced swing signal reaches the first NMOS threshold that turns off the first NMOS transistor.

* * * * *